(12) United States Patent
Kong

(10) Patent No.: US 6,501,297 B1
(45) Date of Patent: Dec. 31, 2002

(54) RESOURCE COST ASSIGNMENT IN PROGRAMMABLE LOGIC DEVICE ROUTING

(75) Inventor: Raymond Kong, San Francisco, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/946,873

(22) Filed: Sep. 5, 2001

(51) Int. Cl.⁷ .................................................. H03K 7/38
(52) U.S. Cl. .............................. 326/41; 326/38; 326/39
(58) Field of Search ..................................... 326/37–41

(56) References Cited

U.S. PATENT DOCUMENTS 5,914,616 A  6/1999  Young et al.
6,269,470 B1 * 7/2001 Paz ............................. 716/12
6,335,634 B1 * 1/2002 Reddy et al. ................. 326/41

* cited by examiner

*Primary Examiner*—Michael Tokar
*Assistant Examiner*—Anh Tran
(74) *Attorney, Agent, or Firm*—H. C. Chan

(57) ABSTRACT

The resource cost associated with each resource in a programmable logic device (PLD) can be obtained from topology information. In one embodiment, the PLD can be geometrically divided into an array of logical tiles. The cost can be set equal to the number of tiles the resource intersects (span). A signal path between a source and a destination can be routed using this resource cost. In another embodiment, the cost is set as the maximum value between the vertical and horizontal spans (instead of the total span). This embodiment often increases the speed of routing.

9 Claims, 2 Drawing Sheets

RESOURCE COST ASSIGNMENT IN PROGRAMMABLE LOGIC DEVICE ROUTING

FIELD OF THE INVENTION

The present invention relates to programmable logic devices (PLDs), and more particularly to a method for assigning costs to routing resources in PLDs.

BACKGROUND OF THE INVENTION

A typical FPGA comprises a large plurality of configurable logic blocks (CLBs) surrounded by input-output blocks and interconnectable through a routing structure. The routing structure comprises many interconnect wires and associated programmable interconnect points (PIPs). In one embodiment, a PIP contains a pass transistor that can be turned on and off, thereby allowing an associated interconnect wire to be either connected or disconnected (depending on the state of the transistor) to other circuit elements. The CLBs and routing structure of the FPGA are arranged in an array or in a plurality of sub-arrays wherein respective CLBs and associated portions of the routing structure are placed edge to edge in what is commonly referred to as a tiled arrangement. An example of such a tiled arrangement is described in U.S. Pat. No. 5,914,616 entitled "FPGA Repeatable Interconnect Structure with Hierarchical Interconnect Lines." The CLB portion of a tile comprises a plurality of primitive cells which may be interconnected in a variety of ways to perform a desired logic function. For example, a CLB may comprise a plurality of lookup tables (LUTs), multiplexers and registers. As used herein, the term "primitive cell" means the lowest level of user accessible component.

When an FPGA comprises thousands of CLBs in large arrays of tiles, the task of establishing the required multitude of interconnections between primitive cells inside a CLB and between the CLBs becomes so onerous that it requires software tool implementation. Accordingly, the manufacturers of FPGAs, including Xilinx, Inc., the assignee hereof, have developed place and route software tools that may be used by their customers to implement their respective designs. Place and route tools not only provide the means of implementing users' designs, but can also provide an accurate and final analysis of static timing and dynamic power consumption for an implemented design scheme.

Routing tools are very important in determining the performance of a circuit implemented on a FPGA. If signals are not routed properly, excessive amount of resources are used to carry signals. This could lead to design with poor timing and power performance. Further, routing tools are very difficult to develop and very time consuming to execute. Consequently, it is important to improve routing tools.

SUMMARY OF THE INVENTION

The present invention involves a method for routing a signal from a source to a destination in a PLD that has a plurality of routing resources. The topology information of each of the plurality of resources is obtained. In one embodiment, the PLD can be geometrically divided into an array of logical tiles. These tiles can be used to supply the topology information. Each of the plurality of resources is assigned a cost based on its associated topology information. For example, the cost can be set as the number of tiles the resource intersects ("span"). A signal path between the source and destination can be routed using the cost information for the resources.

In one embodiment of the present invention, the cost is set as the maximum value between the vertical and vertical spans (instead of the total span). This embodiment often increases the speed of routing.

The above summary of the present invention is not intended to describe each disclosed embodiment of the present invention. The figures and detailed description that follow provide additional example embodiments and aspects of the present invention.

BRIEF DESCRIPTION OF THE DRAWINGS

The present invention is illustrated by way of example, and not by way of limitation, in the detailed description and the following figures, in which like reference numerals refer to similar elements.

DETAILED DESCRIPTION OF THE INVENTION

The present invention relates to a new method for assigning costs in routing algorithms. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

An important algorithm of routing signals in semiconductor devices is the so-called "Maze router." In this method, the workspace of an integrated circuit is divided into a uniform grid of cells. Routing can be treated as solving a problem of walking through a maze. The idea is to find an optimal path from one cell to another given a few roadblocks and constraints. More detailed description of Maze routers can be found in a book by Bryan Preas and Michael Lorenzetti, "Physical Design Automation of VLSI Systems," The Benjamin/Cummings Publishing Company Inc., copyrighted 1988, pp.163–167.

The Maze router can be adapted very well to FPGA routing fabric. A directed graph is typically used to model the FPGA device. Each wire and PIP of the FPGA is mapped to a node and arc, respectively, in a directed graph. The Maze router algorithm is applied on the directed graph to find routing solutions. At a basic level, the algorithm searches for a feasible path between a signal source and destination by performing a breadth first graph search. The algorithm strives to find the minimum cost path between signal source and destination: it searches for a solution using the minimum number of nodes and arcs for a signal connection. However, from actual design results and strong empirical evidence, it is observed that not all nodes in the directed graph should have the same cost. This is because not all nodes have the same length or connectivity. In a given FPGA device, there are a number of varying wire types, shapes, connectivity, and availability. Without uniformity in their attributes, the FPGA wiring resources, or graph nodes, cannot share the same cost and must be assigned cost values that reflect their distinguishing attributes.

Previously, the task of assigning resource or node costs has been a form of "black magic". There is no automated or systematic method in arriving at these cost assignments. The task typically involves large degrees of engineering judgment, experimentation, tuning, and pouring over routing results to get a set of resource costs that yields reasonably good results. It requires fair amount of engineering time. In addition, the set of resource costs is highly coupled to a FPGA architecture. As a result, this task needs to be repeatedly performed for each new FPGA architecture (or if there is a change to an existing FPGA routing structure). Consequently, a non-trivial amount of engineering staff time is required to support all FPGA architectures of a vendor.

Figure 1:
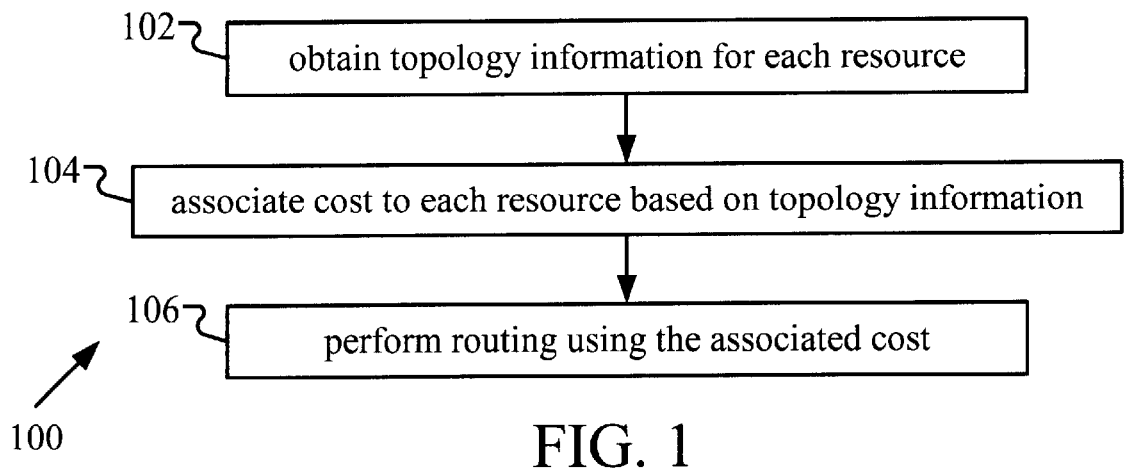
FIG. 1 is a flow chart showing the method of the present invention.

In order to remove the problems of convention routers, a new approach in resource cost assignment is now disclosed. Under this approach, the topology information for each wire in a programmable logic device is extracted from the device and subsequently use for resource costing. FIG. 1 is a flow chart 100 showing such an approach. In step 102, the topology information of each resource is obtained. In step 104, each resource is assigned a cost based on the topology information. In step 106, routing is performed using this cost assignment.

Figure 2:
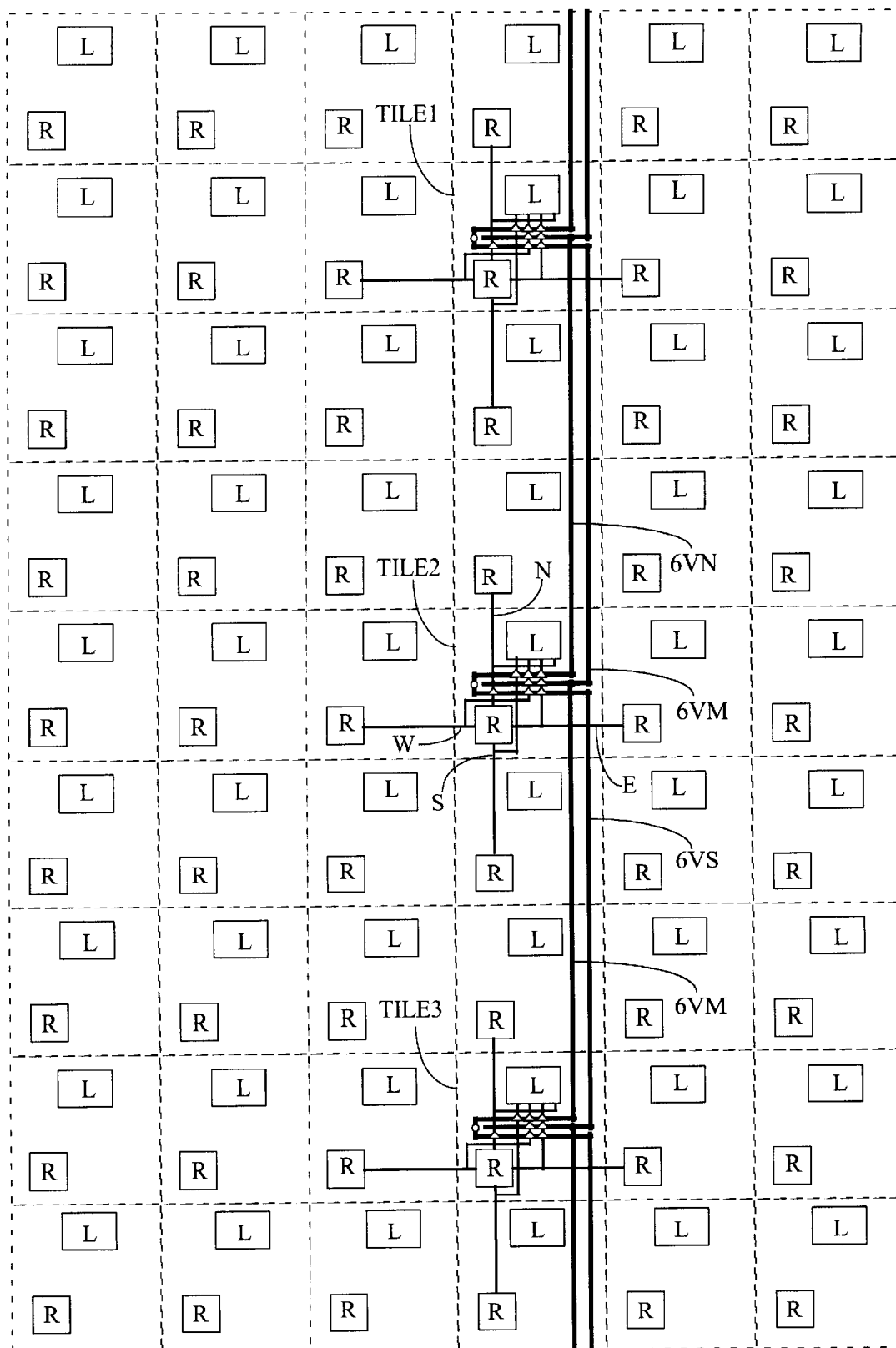
FIG. 2 shows an exemplary structure of a FPGA that can be used in the present invention.

This method can be advantageously applied to FPGA. A brief description of an exemplary structure of a FPGA is provided below and in FIG. 2 for better understanding of the present invention. This drawing illustrates part of an array of tiles in an FPGA. In each tile is logic block L and a routing or switching structure R. Also in each tile are wire segments which connect to other wire segments in adjacent tiles to form interconnect wires. Most of the interconnect wires in the FPGA are not shown in FIG. 2 so as not to obscure the connectivity of the invention. Three of the tiles, labeled TILE1, TILE2, and TILE3 are shown in more detail, and interconnect wires extending from TILE1, TILE2, and TILE3 are shown. In the FPGA of FIG. 2, programmable connections are provided by using PIPs, wherein each PIP includes at least one transistor.

Under the method of the present invention, a FPGA device can be viewed as a collection of logic and routing resources organized in a regular tiled fashion. Each tile (a region of logic and routing resources) is replicated as needed on the device. Each wire may span one or more such tiles. For example, the lines labeled N, E, S and W span one tile while the lines labeled 6VM, 6VN and 6VS span more than three tiles. Each wire's topology is precisely defined by the set of tiles that it spans. These spanning tiles are contiguous and serve as a wire's footprint in a FPGA device. From these tiles, the wire length can be computed by recording the number of the tiles that the wire intersects; this is referred to as a wire's "span." In one embodiment, the resource cost of a wire can be simply the assignment of its span.

Note that a user may define a topology for cost assignment purpose to be different from the physical architecture of the resources. For example, another user may desires to use a topology wherein a group of four adjacent tiles of FIG. 2 is considered one unit. Alternatively, a third user may subdivide the tiles of FIG. 2 into a number of sub-units. In the present invention, the unit of measurement for cost purpose is called a topology unit. In the preferred embodiment, the topology comprises a plurality of rectangular or square topology units. The span of a wire is determined using the user-defined topology.

This new method has a number of advantages over conventional approaches. Firstly, in the conventional approach, a predetermined maximum (e.g., 16) unique resource costs are allowed for all wires. Simplification was used to categorize wires into 16 classes, and each class has an associated resource costs. In the new approach, there is no artificial limit in. the number of unique resource costs used. The resource costs are purely based on the wire topology; it provides a basis for more accuracy, increased granularity, and more generic method for resource costing. Second, this approach of resource costing is completely generic; it can apply to any FPGA device that can be logically divided into grids-liked topology. It can be applied to all existing and new architectures. Thirdly, the same software algorithm can be used to handle many types of FPGA architectures. This feature significantly reduces the overall engineering time and lowers development risk by consolidating all resource costing mechanism to a single costing engine. Furthermore, this approach is found to produce comparable quality of results under non-timing driven routing. There is no loss to routability or run-time. Lastly, this approach allows for very accurate future costing during the Maze routing process which bears large impact to overall design routability and routing run-time. In the conventional approaches, each wire had a single (x, y) coordinate to denote the wire's location. It follows that as wire lengths increase, the error in the distance computations between two wires will also increase. This will lead to inaccurate future costing and will suffer in inefficient searches. In the new method, a wire's entire span is considered in the distance computation. As a result, it is extremely accurate.

Figure 3:
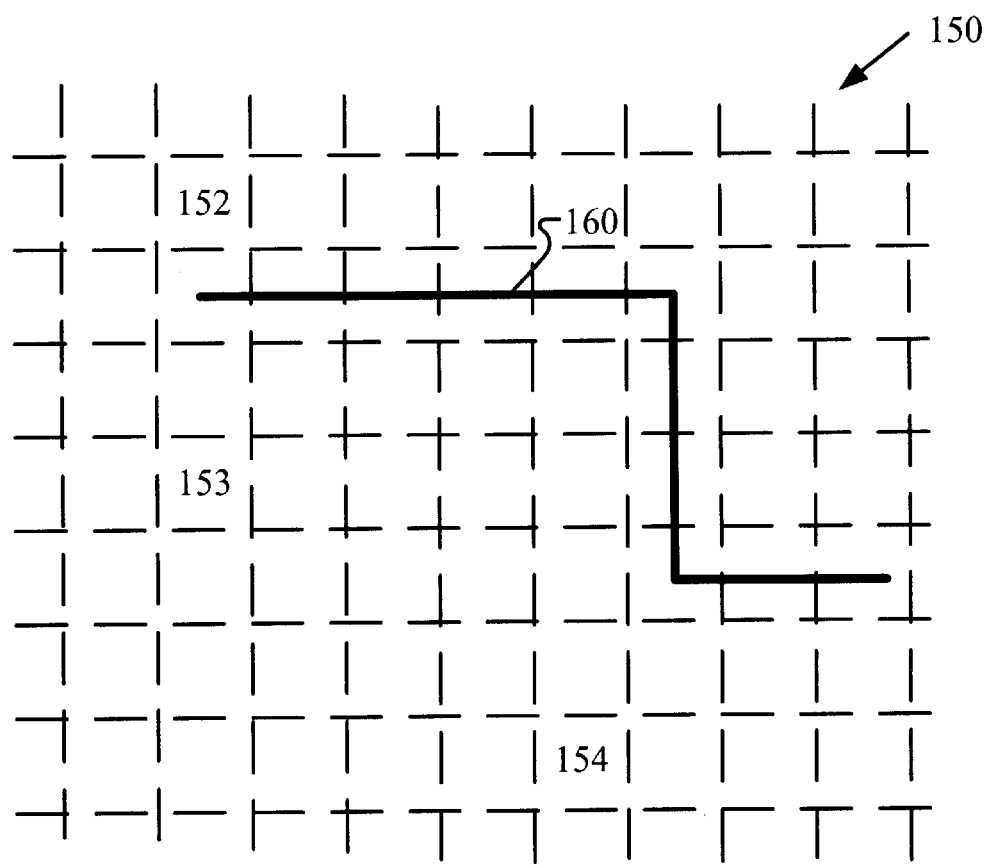
FIG. 3 illustrates another embodiment of assigning resource cost of the present invention.

Another embodiment of this invention is to consider a different aspect of measurement as the resource cost. A less precise but very effective approach is to use the dominant dimension of a wire. In other words, the resource cost can be assigned as the maximum between the vertical and the horizontal spans (referred herein as a wire's dominant span). FIG. 3 illustrate this cost assignment for a section 150 of a FPGA. Section 150 is covered by a user-defined topology, which comprises a plurality of rectangular tiles, such as tiles 152–154. Each tile is a topology unit. The cost assigned to a wire 160 can be determined as the maximum between its horizontal span (seven in this case) and vertical span (three in this case). Thus, in this example, the dominant span (and thus the cost assignment) is seven. This is different from the previous described embodiment wherein the cost is the total span of the wire (in this example, ten).

For wires that have unequal horizontal and vertical spans, as commonly found in a FPGA device, the dominant span adapts nicely with Maze routing. Since a Maze router only consider at most one single direction at a time, it is quite fitting to only consider a wire's horizontal or vertical component.

In summary, this new approach makes the assignment of resource costs generic for all FPGA architectures. All architectures can take advantage of it and leverage its use. Furthermore, the quality of routing results received from this new approach is comparable with existing approaches. Thus, this new approach can significantly reduce the required engineering staff time without foregoing any routing quality.

It can be seen from the above description that a novel method for assigning costs in routing has been disclosed. Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

I claim:

1. A method for routing a signal from a source to a destination in a PLD that has a plurality of routing resources, comprising the steps of:

associating said PLD with a plurality of topology units;

determining a span for each of said plurality of resources, said span being measured in terms of said topology units;

assigning a cost to each of said plurality of resources based on said span; and determining a signal path from said source to said destination using said cost assigned to each of said plurality of resources.

2. The method of claim 1 wherein each of said plurality of topology units is rectangular in shape.

3. The method of claim 1 wherein each of said plurality of topology units is a square.

4. The method of claim 1 wherein said span is the total number of topology units its corresponding resource intersects.

5. The method of claim 4 wherein each of said plurality of topology units is rectangular in shape.

6. The method of claim 4 wherein each of said plurality of topology units is a square.

7. The method of claim 1 wherein said span is the maximum number of topology units its corresponding resource intersects in a vertical and a horizontal direction.

8. The method of claim 7 wherein each of said plurality of topology units is rectangular in shape.

9. The method of claim 7 wherein each of said plurality of topology units is a square.

* * * * *